United States Patent [19]

Dehganpour et al.

[11] Patent Number: 4,758,743
[45] Date of Patent: Jul. 19, 1988

[54] OUTPUT BUFFER WITH IMPROVED DI/DT

[75] Inventors: Sam Dehganpour; Perry H. Pelley, III, both of Austin, Tex.

[73] Assignee: Motorola, Inc., Schaumburg, Ill.

[21] Appl. No.: 911,702

[22] Filed: Sep. 26, 1986

[51] Int. Cl.⁴ .................. H03K 17/04; H03K 17/12; H03K 17/284; H03K 17/687

[52] U.S. Cl. .................. 307/443; 307/246; 307/296 R; 307/451; 307/270; 307/548

[58] Field of Search .................. 307/443, 52, 85, 448, 307/450, 451, 475, 544, 546, 548, 554, 555, 568, 246, 571, 576, 579, 585, 270, 592, 594, 297, 304, 314, 575

[56] References Cited

U.S. PATENT DOCUMENTS

| | | | |
|---|---|---|---|
| 3,651,340 | 3/1972 | Cliff | 307/451 |
| 4,103,188 | 7/1978 | Morton | 307/451 X |
| 4,567,378 | 1/1986 | Raver | 307/443 X |
| 4,609,834 | 9/1986 | Gal | 307/246 X |
| 4,612,466 | 9/1986 | Stewart | 307/443 X |
| 4,622,482 | 11/1986 | Ganger | 307/585 |
| 4,634,894 | 1/1987 | Shu et al. | 307/548 X |
| 4,638,187 | 1/1987 | Boler et al. | 307/579 X |
| 4,661,928 | 4/1987 | Yasuoka | 307/575 X |

Primary Examiner—Stanley D. Miller
Assistant Examiner—David R. Bertelson
Attorney, Agent, or Firm—John A. Fisher; Jeffrey Van Myers; James L. Clingan, Jr.

[57] ABSTRACT

An integrated circuit comprises a chip containing electric circuits in a package with leads. The chip receives power via the leads. The leads have inductance so that when there is a change in current flow (di/dt) through a lead there is a voltage which is developed between the end of the lead and the chip which can cause the chip to either malfunction or function poorly. The highest di/dt is generally caused by an output buffer that changes the logic state of its output. The typical output buffer has a pair of driver transistors that provide one of a logic high or logic low. The di/dt generated by these transistors is controlled by controlling the voltage on the gate of the transistor which is providing the particular logic state. This control reduces di/dt from that typically provided at the very beginning of a logic state transition but increases it over that typically provided immediately thereafter for the purpose of optimizing logic state transition speed for a given maximum di/dt.

7 Claims, 2 Drawing Sheets

OUTPUT BUFFER WITH IMPROVED DI/DT

FIELD OF THE INVENTION

The present invention relates to buffers, and more particularly, to buffers which have inductance between a power source and the buffer.

BACKGROUND OF THE INVENTION

In integrated circuits, there is generally a piece of silicon known as a die or chip which contains electrical circuits and which is connected to a lead frame. The chip has bonding pads which are connected to the lead frame by tiny wires. The lead frame has leads which are used for connecting to a printed circuit board as part of a larger system. The leads of the lead frame have a certain amount of inductance as well as capacitance and resistance. There is also some inductance in the wire from the bonding pad to the lead frame. This wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as $Ldi/dt$, where L is the inductance and $di/dt$ is the time rate of change of the current. As the $di/dt$ becomes larger, the voltage across the inductance becomes larger. This voltage drop across an inductance causes a voltage differential between the lead location on the circuit board and the bonding pad to which it is connected on the integrated circuit. This can create a problem of having the internal supply at different voltage than the voltage of the external supply.

This problem can be described by reference to FIG. 1 which shows a portion of an integrated circuit comprised of an output buffer 11, an internal positive power supply terminal VCCin connected to an external positive power supply terminal VCCex, an internal negative power supply terminal VSSin connected to an external negative power supply terminal VSSex, an internal output terminal Qin connected to an external output terminal Qex. Ouput buffer 11 is receives power from its connections to VCCin and VSSin. In typical currently used integrated circuits, VCC is nominally 5 volts. Output buffer 11 provides an output on Qin. VCCin is an internal bonding pad on the chip portion of the integrated circuit. VCCex is the tip of one of the leads of the lead frame portion of integrated circuit 10. VSSin is an internal bonding pad on the chip portion of integrated circuit 10. VSSex is the tip of one of the leads of the lead frame portion of integrated circuit 10. Qin is an internal bonding pad on the chip portion of integrated circuit 10. Qex is the tip of one of the leads of the lead frame portion of integrated circuit 10. Inductances indicated as L1, L2, and L3 represent the inductances present by virtue of the connections between VCCin and VCCex, VSSin and VSSex, and Qin and Qex, respectively.

When output buffer 11 switches logic states, there will be a change in the current flowing into or out of input buffer with respect to Qin. The amount of the current flowing will depend at least somewhat on a load which will be present on Qex. If the current changes so that more current is flowing to Qin, there will also be more current flowing from VCCin to output buffer 11 which in turn means that more current will be flowing between VCCex and VCCin. This change in current flow will cause a voltage drop between VCCin and VCCex by virtue of inductance L1. This voltage drop will be proportional to how rapidly the current changes between VCCin and VCCex. The expression for this voltage drop is $L1di/dt$. The $L1di/dt$ voltage drop is thus the difference between the power supply voltage which is present on the circuit board and the internal power supply which is used to drive the internal circuitry of integrated circuit 10. If this $L1di/dt$ becomes sufficiently large, the logic state of other inputs to integrated circuit 10 can be misinterpreted. What the external circuit board interprets as a logic low may be interpreted as a logic high by integrated circuit 10 because the internal power supply voltage is so low. Although this differential between internal and external power supply voltage is only for the duration of the high rate of change of current, this can result in providing an erroneous output in an integrated circuit that is externally clocked or a significant delay in providing a valid output in an integrated circuit that is static.

The same type of situation can occur for the case in which output buffer 11 begins sinking current from Qin. In such case there will be a current change between output buffer 11 and VSSin which will also be present between VSSin and VSSex. The consequent change in current flow through L3 will cause a voltage drop between the internal VSSin and the external VSSex. This will have the affect of raising the voltage of the internal ground (VSS) above that of the circuit board ground. If this voltage differential becomes sufficiently large, then inputs to integrated circuit 10 may be misinterpreted. A signal which is a logic high with respect to the circuit board which is using VSSex as the ground reference, may be interpreted by integrated circuit 10 as a logic low because VSSex is too high of a voltage.

One conventional solution has been to keep the device sizes of the output buffer sufficiently low so that the output buffer does not cause too large of a current change. This of course is a sacrifice of speed. Another solution has been to add more power supply leads so that the current change is spread over more leads. More leads can viewed as placing inductors in parallel which decreases the inductance. This adds to the cost of the package as well as requiring more space on the circuit board.

The typical $di/dt$ response to a typical logic state transition of a MOS type output is shown in FIG. 2. Shown in FIG. 2 is the logic low to logic high case. The transition begins at time t0 and is complete at a time t1. The resulting change in current is shown as $di/dt$. A positive spike begins at time t0 when the current is increasing most rapidly. The rate of change of current falls off rapidly and becomes negative. The current is stabilized at time t1. The maximum height of the $di/dt$ spike causes the maximum voltage differential between the internal power supply and the external power supply. Another solution is to provide a second pull-down device in the output buffer which is driven from an RC delayed signal so that there is somewhat of a stagger effect in changing the current flow. This results in two di/dt spikes so that the maximum spike height is lowered. This is an improvement but still not optimum. The problem has been most frequently seen in output buffers but internal buffers can have the same problem if there is a large current change. One example is the simultaneous precharging of the bit lines of a memory.

SUMMARY OF THE INVENTION

An object of the present invention is to provide an improved buffer circuit.

Another object of the invention is to provide a buffer with an improved di/dt characteristic.

Yet another object of the invention is to provide an improved buffer circuit for use in an integrated circuit.

These and other objects are achieved in an integrated circuit comprising a package and a chip. The chip contains electrical circuits including a buffer. The chip is contained in the package which has leads. A first lead is connected to a first power supply terminal of the chip and a second lead is connected to a second power supply terminal of the chip. The first and second leads are characterized as having inductance. the buffer comprises a first transistor having a first current electrode coupled to the first power supply terminal, a second current electrode for providing an output of the buffer circuit, and a control electrode; a second transistor having a first current electrode coupled to the control electrode of the first transistor, a control electrode for receiving a first input signal, and a second current electrode; a first resistor having a first electrode coupled to the second current electrode of the second transistor, and a second electrode coupled to the second power supply terminal; a third transistor having a first current electrode coupled to the second power supply terminal, a second current electrode coupled to the second current electrode of the first transistor, and a control electrode; a fourth transistor having a first current electrode coupled to the control electrode of the first transistor, a control electrode for receiving a second input signal complementary to the first input signal, and a second current electrode; and a second resistor having a first electrode coupled to the second current electrode of the fourth transistor, and a second current electrode coupled to the second power supply terminal.

DESCRIPTION OF THE INVENTION

Figure 1:
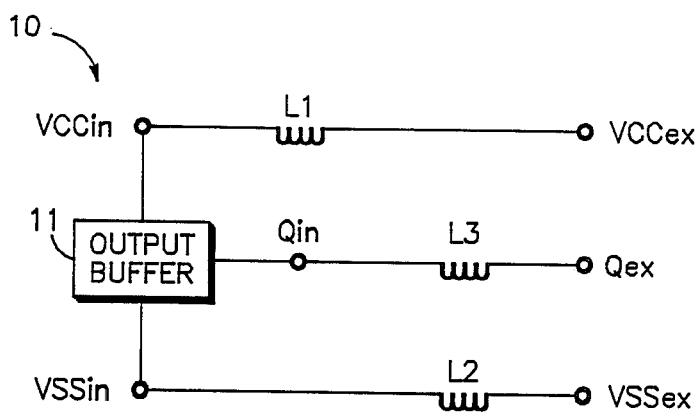
FIG. 1 is a combination circuit diagram and block diagram of a portion of an integrated circuit according to the prior art.
Figure 2:
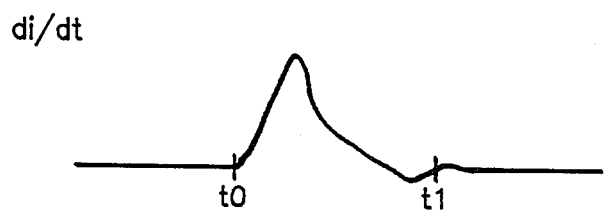
FIG. 2 is a diagram of a typical shape of time rate of change of current supplied by a buffer of the prior art.
Figure 3:
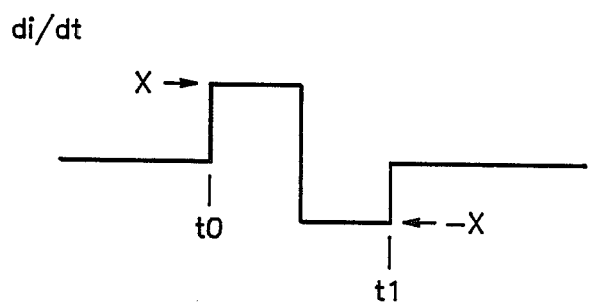
FIG. 3 is a diagram of a desired shape of time rate of change of current supplied by a buffer.

Shown in FIG. 3 is a desired shape of the time rate of change of the current drawn by a buffer, particularly for buffers which cause a large current change, such as an output buffer or a driver for precharging bit lines. To achieve a logic state change, there is some amount of charge which must be transferred. There is a steady state charge flow, or current, which must be sustained after the logic state has been changed. There is also capacitance which must be charged as part of the logic state change. Assuming that a logic state change is to be completed within the time from t0 to t1, the optimum di/dt curve is shown in FIG. 3. The rate of current change will be zero until time t0. At time t0, di/dt will reach a certain value and remain at that level until about half way through the logic state change. At that point the current needs to decrease to the steady state condition. This decrease should also occur at a constant rate until time t1. Although the negative portion of di/dt can potentially be as significant of a problem as the positive side, this is not generally the case. The nature of the circuitry generally causes slow changes as the steady state condition is approached. The nature of MOS transistors is such that when they are in the triode region, the current is proportional to the drain to source voltage. As the transistor that is charging an output node has its drain and source connected between a power supply terminal and the output node so that as the node becomes charged, the drain to source voltage decreases so that the current is reduced. There is thus in the nature of output transistors a relatively smooth di/dt reduction. Also the new logic state is actually reached before the steady state condition is reached. For example, a buffer may provide a logic high at a steady state of 5 volts but a logic high is certain to be recognized when 4 volts is reached. In such case the rate at which the output moves from 4 volts to 5 volts is not significant. Consequently, the di/dt reduction is not generally a major consideration. The objective then is to reach the level at which a logic high is certain to be detected as fast as possible without causing a di/dt which is too great. A constant di/dt is thus the goal for at least the first half of the logic state transition.

Figure 4:
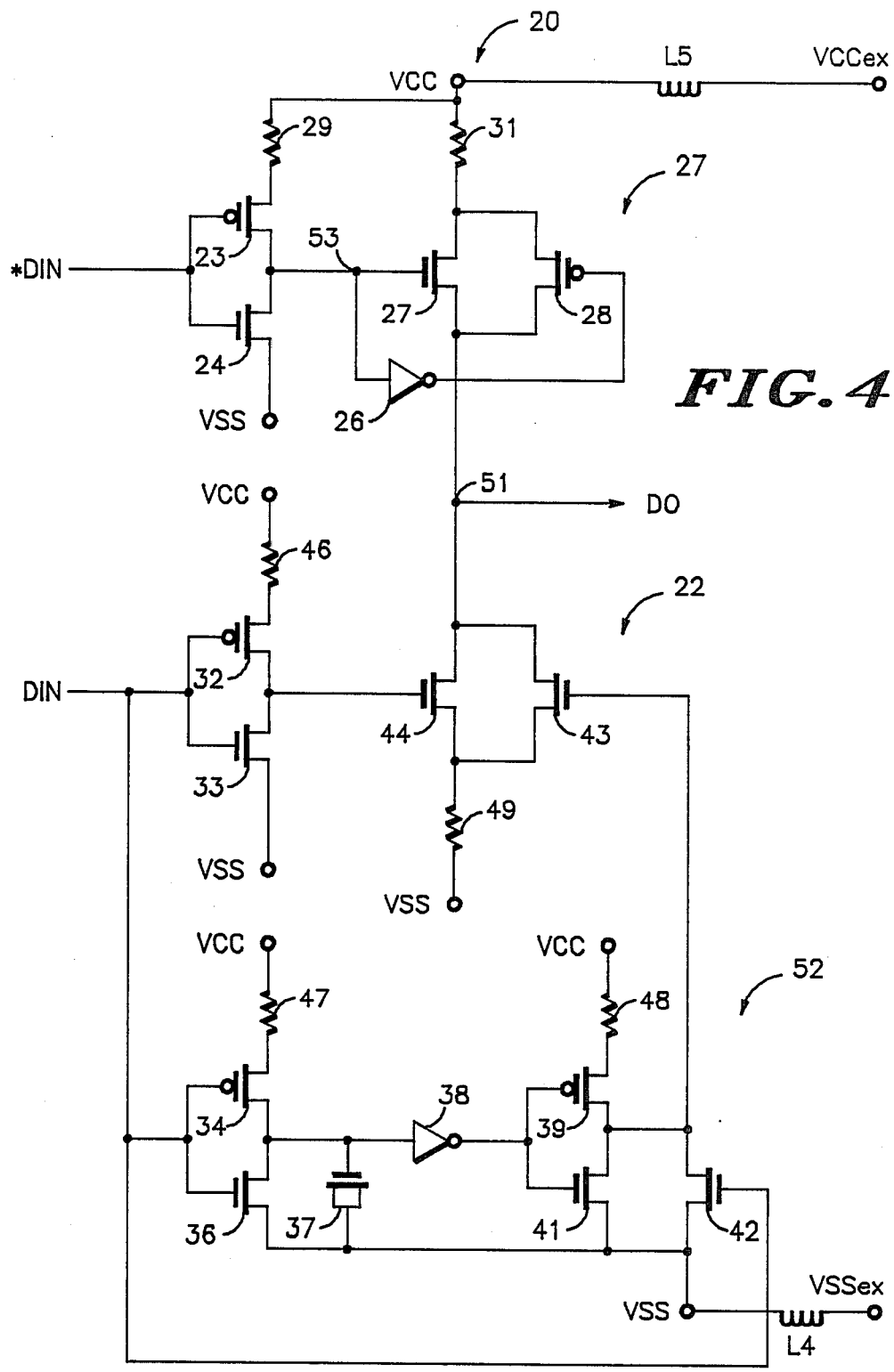
FIG. 4 is circuit diagram of an output buffer according to a preferred embodiment of the invention.

Shown in FIG. 4 is an output buffer 20 which has di/dt characteristic which more closely approximates that shown in FIG. 3 than those of the prior art. Buffer 20 generally comprises a logic high driver 21 and a logic low driver 22. Logic high driver 21 comprises a P channel transistor 23, an N channel transistor 24, an inverter 26, an N channel transistor 27, a P channel transistor 28, a resistor 29, and a resistor 31. Logic low driver 22 comprises a P channel transistor 32, an N channel transistor 33, a P channel transistor 34, an N channel transistor 36, a capacitor 37, an inverter 38, a P channel transistor 39, an N channel transistor 41, an N channel transistor 42, N channel transistor 43, an N channel transistor 44, a resistor 46, a resistor 47, a resistor 48, and a resistor 49.

Transistor 23 has a gate for receiving an input signal *Din, a source, and a drain. Transistor 24 has drain connected to the drain of transistor 23, a source connected to a negative power supply terminal VSS, and a gate for receiving signal *Din. VSS in the present embodiment can be, for example, be connected to ground. Output buffer 20 is intended for use as a buffer in an integrated circuit in which VSS is connected to a lead of a lead frame in a conventional manner. The lead of the lead frame which is connected to VSS is for connecting to a circuit system negative power supply which may be, for example, ground potential. This connection to an external ground via the lead is shown as terminal VSSex. An inductance L4, representative of the inductance between the internal negative power supply terminal VSS and the end of the lead which is connected to VSSex. Resistor 29 has a first electrode connected to the source of transistor 23, and a second electrode connected to a positive power supply terminal VCC. VCC in the present embodiment can be, for example, 5 volts. Output buffer 20 is intended for use as a buffer in an integrated circuit in which VCC is connected to a lead of the lead frame in a conventional manner. The lead of the lead frame which is connected to VCC is for connecting to a circuit system positive power supply which may be, for example, 5 volts. This connection to an external power supply via the lead is shown as terminal VCCex. An inductance L5, representative of the inductance between the internal power supply terminal VCC and the end of the lead which is connected to VCCex. Resistor 29 has a first electrode connected to the source of transistor 23, and a second electrode connected to a positive power supply terminal VCC. Inverter 26 has an input connected to the drains of transistors 23 and 24, and an output. Transistor 27 has a gate connected to the drains of transistors 23 and 24, a source connected to an output node 51, and a drain. Transistor 28 has a gate connected to the output of inverter 26, a drain connected to node 51, and a source connected to the drain of transistor 27. Resistor 31 has a first electrode connected to the drain of transistor 27, and a second electrode connected to VCC.

Transistor 32 has a gate for receiving an input signal Din, a drain, and a source. Transistor 33 has a gate for receiving signal Din, a drain connected to the drain of transistor 32, and a source connected to VSS. Resistor 46 has a first electrode connected the source of transistor 32, and a second electrode connected to VCC. Transistor 34 has a gate for receiving signal Din, a source, and a drain. Transistor 36 has a gate for receiving signal Din, a drain connected to the drain of transistor 34, and a source connected to ground. Resistor 47 has a first electrode connected to the drain of transistor 34, and a second electrode connected to VCC. Capacitor 37 has a first electrode connected the drains of transistors 34 and 36, and a second electrode connected to VSS. Inverter 38 has an input connected to the drains of transistors 34 and 36, and an output. Transistor 39 has a gate connected to the output of inverter 38, a drain, and a source. Transistor 41 has a gate connected to the output of inverter 38, a drain connected to the drain of transistor 39, and a source connected to VSS. Resistor 48 has a first electrode connected to the source of transistor 39, and a second electrode connected to VCC. Transistor 42 has gate for receiving signal Din, a drain connected to the drain of transistor 41, and a source connected to VSS. Transistor 43 has a gate connected to the drains of transistors 39 and 41, a drain connected to node 51, and a source. Transistor 44 has a gate connected to the drains of transistors 32 and 33. Resistor 49 has a first electrode connected to the sources of transistors 43 and 44, and a second electrode connected to VSS.

Signals Din and *Din are complementary signals. Buffer 20 provides an output signal DO at node 51 representative of signals Din and *Din. Signal DO can also be conveniently provided as a high impedance, commonly known as tri-state, by signals Din and *Din both being a logic high. This is a useful but not necessary feature of buffer 20. Buffer 20 can be useful even if signals Din and *Din are always complementary. In many memory devices, complementary signals such as Din and *Din are provided by virtue of the memory itself. In dynamic random access memories (DRAMs), the output of one memory cell is compared to that of a reference and complementary signals are generated response to a comparison thereof. In static random access memories (SRAMs), the cell itself stores data in complementary form so that the accessing thereof results in complementary signals being generated. In both DRAMs and SRAMs, the generated complementary signals are further controlled so that an output buffer such as buffer 20 can be tri-stated under certain conditions. If complementary signals, however, are not already provided, they can be generated by simply providing an inverter between signal Din and the gates of transistors 23 and 24. Signal Din is the true signal in that the logic state of signal Din is provided as the logic state of signal DO when buffer 20 is active. Buffer 20 is not considered active when it is tri-stated.

The particular embodiment of buffer 20, unless stated otherwise, is for transistors with a 1.5 micron channel length. Capacitor 37 is formed from a transistor in which the source and drain thereof are connected together to form the electrode which is connected to VSS. The threshold voltage of the N channel transistors is between 0.6 and 0.8 volt. The threshold voltage of the P channel transistors is between −0.6 and −0.8 volts.

Connected transistor pairs 23 and 24, 32 and 33, 34 and 36, and 39 and 41 operate as inverters. Each of these transistor pairs have a resistor connected between the source of the P channel transistor and VCC for optimizing the rate of change of current, di/dt, upon a logic state transition of signals Din and *Din. Logic high driver 21 responds to signal *Din switching from a logic high to a logic low by causing transistors 27 and 28 to become conductive and thus provide signal DO at a logic high. When signal *Din is a logic high the inverter formed by transistor pair 23 and 24 provide a logic low output to transistor 27 and inverter 26. Transistor 27 is thus non-conductive. Inverter 26 provides a logic high output which causes transistor 28 to be non-conductive. When signal *Din switches to a logic low, the inverter comprised of transistors 23 and 24 provides a logic high output to inverter 26 and transistor 27. Transistor 27 becomes conductive. Inverter 26 provides a logic low to transistor 28 causing it to become conductive. Signal DO is thus provided at a logic high by logic high driver 21 in response to signal *Din switching from a logic high to a logic low.

Logic low driver 22 responds to signal Din switching from a logic high to a logic low by causing transistors 44 and 43 to become conductive and thus provide signal DO at a logic low. When signal Din is a logic high, the inverters comprised of transistor pairs 32 and 33, and 34 and 36, provide a logic low output, and transistor 42 is conductive. Transistors 43 and 44 are thus non-conductive. Inverter 38 provides a logic high to the inverter comprised of transistor pair 39 and 41 which causes transistor 39 to be non-conductive and transistor 41 to be conductive. In response to a transition of signal Din from a logic high to a logic low, the inverters comprised of transistor pairs 32 and 33, and 34 and 36, will provide a logic high output, and transistor 42 will become non-conductive. The logic high output of the inverter comprised of transistors 32 and 33 will cause transistor 44 to become conductive. Inverter 38 responds to the logic high output of the inverter comprised of transistor pair 34 and 36 by providing a logic low output. The inverter comprised of transistor pair 39 and 41 then provides a logic high to transistor 43 causing transistor 43 to become conductive. Logic low driver 22 thus causes signal DO to be a logic low in response to signal Din switching from a logic high to a logic low. The inverter comprised of transistor pair 34 and 36, inverter 38, capacitor 37, and the inverter comprised of transistor pair 39 and 41, form a delay circuit 52 for the purpose of causing transistor 43 to become conductive after transistor 44 has already become conductive.

In the present embodiment, the inductance of L4 and L5 is about 10 nanohenries. This is a typical inductance for current state of the art lead frames and the associated wire bonding techniques. The maximum difference, that is considered acceptable, between the VCC and VCCex is about 0.5 volt. This maximum acceptable difference may vary somewhat, depending upon the particular integrated circuit. Each integrated circuit will, however, have some such maximum acceptable difference. This voltage differential between internal and external power supply terminals caused by a signal switching is often referred to as noise on the supply bus. For the present case, which is a typical case in the art, the maximum rate of change of current is calculated from the equation 0.5 volt equals 10 nanohenries times di/dt. This means that the maximum di/dt is 50 milliamps per nanosecond which is expressed as 50 ma/ns. The optimum buffer would begin supplying or sinking current at the 50 ma/ns rate upon a logic state transition.

Resistors 29 and 46 in buffer 20 are useful in approximating the 50 ma/ns di/dt. Resistors such as resistors 31 and 49 have been used in the past to help slow down the di/dt but there was still a very significant peak of di/dt at the onset of a logic state transition of signal DO. Applicants have discovered that a further improvement in obtaining a constant di/dt is by controlling the voltage on the gates of transistors 27 and 44. This is achieved using resistors 29 and 46. In the case in which signal *Din switches to a logic low to cause signal DO to become a logic high, transistor 23 becomes conductive. As current flows from VCC through transistor 23 and resistor 29, a voltage drop is incurred across resistor 29. This voltage drop across resistor 29 has the affect of reducing the voltage differential between the gate and source of transistor 23. Transistor 23 is thus at a lower conductivity than if resistor 29 were not present. Transistor 23 will be in saturation but at a lower current than if resistor 29 were not present. There is a relatively high capacitance on the gate of transistor 27 because of its connection, shown as at a node 53, to the drains of transistors 23 and 24 and the input of inverter 26. As this capacitance at node 53 becomes charged to about the threshold voltage of a P channel transistor, transistor 23 is no longer in saturation so that the current through transistor 23 is reduced so that the voltage drop across resistor 29 will also be reduced. This causes the gate to source voltage of transistor 23 to be increased so that transistor 23 becomes more conductive. In the absence of resistor 29, there would be no increase in the gate to source voltage of transistor 23 when transistor 23 comes out of saturation and into a triode region. In the triode region, a MOS transistor's current is very much affected by the drain to source voltage whereas in its saturation region the current is almost constant with changes in drain to source voltage. For a given current flow into the capacitance of node 53 at the time immediately following a transition of signal *Din from a logic high to a logic low, there is more current flowing into node 53 after transistor 23 has left the saturation region for the case shown in FIG. 4 with resistor 29 than in the past in which there was no such resistor present.

The problem in the past has been that the highest di/dt was at the onset of a logic state transition. The use of resistor 29 allows for a higher di/dt after the initial onset of the logic state transition. The voltage on node 53 will rise faster in the later stages of the rise than previously. This allows for reducing the initial di/dt to obtain the same speed. The voltage ramping at node 53 provides also an increasing current to be supplied by transistor 27. If the voltage rises faster on node 53, then the current supplied by transistor 27 will also increase at a greater rate. The buffers of the past particularly need to have higher di/dt at the point that signal DO is between about 0.5 and 2.5 volts. This is the region in which the presence of resistor offers the improvement.

In any conventional process for making integrated circuits, the process will result in some devices operating at faster speeds than others because there are limits on how well the process is actually controlled. The di/dt problem has been most severe on the devices which have higher speed. One of the parameters which is subject to process variation and which affects speed is channel length. The integrated circuits which are fabricated with the shorter channel length will have the faster circuits. To compensate for this increase in speed resulting from shorter channel lengths, resistor 29 is advantageously shaped at the same etch step as the step at which the gates of the transistors are etched. In a typical process the channel length is directly related to the gate length. In the particular embodiment, resistor 29 is made of polysilicon as is the gate of transistor 23. Consequently, when the polysilicon gate is etched to form a shorter gate length, the polysilicon which forms resistor 29 is reduced in width which results in higher resistivity of resistor 29. Thus, in the situation in which transistor 23 would tend to increase the rate at which the voltage at node 53 rose and consequently increase di/dt, resistor 29 would tend to reduce the rate at which the voltage at node 53 rose and consequently decrease di/dt. This compensation effect is a very desirable feature of buffer 20. Gates of transistors are also fabricated using refractory metals in combination with polysilicon. This compensation effect could still be implemented with a polysilicon resistor by etching the polysilicon resistor at the same time the gate is etched.

The operation of resistor 46 and transistors 32 and 33 in response to signal Din switching from a logic high to a logic low is essentially the same as that described for resistor 29 and transistors 23 and 24 in response to signal *Din switching from a logic high to a logic low. Resistor 46 is also made of polysilicon which is etched at the same time as the gate of transistor 32. Consequently, in the case where process variation results in a smaller channel length to cause transistor 32 to tend to increase di/dt, resistor 46 is increased in resistance which tends to decrease di/dt so that there is compensation for the case in which process variation makes the circuits operate faster. Delay circuit 52 is useful in optimizing di/dt. Transistor 43 becomes conductive to prevent di/dt from declining too much. The voltage applied to the gate of transistor 43 is also shaped to avoid a di/dt spike upon transistor 43 becoming conductive. This is achieved by using resistor 48 in much the same way as resistors 29 and 46 are used. Resistor 48 is polysilicon which is etched at the same time as the gate of transistor 39 is etched. Resistor 47, made from polysilicon, is also useful in compensating for the case in which process variation results in shorter channel lengths because the capacitance of capacitor 37 is directly proportional to gate length. So as the capacitance decreases, which would tend to reduce the delay in delay circuit 52, the resistance of resistor 46 will increase, tending to increase the delay of delay circuit 52.

We claim:

1. In an integrated circuit comprising a package and a chip containing electrical circuits, the chip characterized as being contained in the package the package characterized as having leads, wherein a first lead is connected to a first power supply terminal of the chip and a second lead is connected a second power supply terminal of the chip, the first and second leads characterized as having inductance, a buffer circuit in the chip, comprising:

a first transistor having a first current electrode coupled to the first power supply terminal, a second current electrode for providing an output of the buffer circuit, and a control electrode;

a second transistor having a first current electrode coupled to the control electrode of the first transistor, a control electrode for receiving a first input signal, and a second current electrode;

a first resistor having a first electrode coupled to the second current electrode of the second transistor, and a second electrode coupled to the second power supply terminal;

a third transistor having a first current electrode coupled to the second power supply terminal, a second current electrode coupled to the second current electrode of the first transistor, and a control electrode;

a fourth transistor having a first current electrode coupled to the control electrode of the third transistor, a control electrode for receiving a second input signal complementary to the first input signal, and a second current electrode;

a second resistor having a first electrode coupled to the second current electrode of the fourth transistor, and a second current electrode coupled to the second power supply terminal;

a fifth transistor having a first current electrode coupled to the first power supply terminal, a second current electrode coupled to the control electrode of the first transistor, and a control electrode for receiving the first input signal;

a sixth transistor having a first current electrode coupled to the first power supply terminal, a second current electrode coupled to the control electrode of the third transistor, and a control electrode for receiving the second input signal;

a seventh transistor having a first current electrode coupled to the first power supply terminal, a second current electrode coupled to the second current electrode of the first transistor, and a control electrode; and a delay circuit, having an input for receiving the first input signal and an output coupled to the control electrode of the seventh transistor, for providing a time delay between the input and output of said delay circuit.

2. The buffer circuit of claim 1 wherein the delay circuit comprises:

an eighth transistor having a first current electrode coupled to the second power supply terminal, a second current electrode coupled to the control electrode of the seventh transistor, and a control electrode; and a delay portion, having an input for receiving the first input signal and an output coupled to the control electrode of the eighth transistor, for providing a time delay between the input and output of said delay portion.

3. The buffer circuit of claim 2 further comprising:

an inverter having an input coupled to the first current electrode of the fourth transistor, and an output; and a ninth transistor having a control electrode coupled to the output of the inverter, a first current electrode coupled to the second power supply terminal, and a second current electrode coupled to the second current electrode of the third transistor.

4. The buffer circuit of claim 3 further comprising a third resistor interposed between the first current electrode of the first transistor and the first power supply terminal.

5. The buffer circuit of claim 4 further comprising a fourth resistor interposed between the first current electrode of the third transistor and the second power supply terminal.

6. In an integrated circuit comprising a chip containing electrical circuits contained in a package having leads, wherein a first lead is connected to a first power supply terminal of the chip and a second lead is connected to a second power supply terminal of the chip, the first and second leads characterized as having inductance, a buffer circuit in the chip for providing an output on an output terminal at a logic state representative of buffer signal, comprising:

driver means, coupled to the first power supply terminal and having an input, for providing current from the first power supply terminal to the output terminal in proportion to a voltage level on said input;

a first resistor having a first terminal coupled to the second power supply terminal, and a second terminal;

a first transistor having a control electrode for receiving a first data signal, a first current electrode coupled to the second terminal of the first resistor, and a second current electrode coupled to the input of the driver means;

a second transistor having a first current electrode coupled to the first power supply terminal, a control electrode for receiving the first data signal, and a second current electrode coupled to the input of the driver means;

a third transistor having a first current electrode coupled to the first power supply terminal, a second current electrode coupled to the output terminal, and a control electrode; and a delay circuit, having an input for receiving the first input signal and an output coupled to the control electrode of the third transistor, for providing a time delay between the input and output of said delay circuit.

7. The buffer circuit of claim 6 wherein the delay circuit comprises:

a fourth transistor having a first current electrode coupled to the second power supply terminal, a second current electrode coupled to the control electrode of the third transistor, and a control electrode; and a delay portion, having an input for receiving the first input signal and an output coupled to the control electrode of the fourth transistor, for providing a time delay between the input and output of said delay portion.

* * * * *